United States Patent [19]
Larsson et al.

[11] Patent Number: 5,588,300
[45] Date of Patent: Dec. 31, 1996

[54] THERMOELECTRIC REFRIGERATION SYSTEM WITH FLEXIBLE HEATCONDUCTING ELEMENT

[76] Inventors: Stefan Larsson, Sjömansgatan 17 D, Göteborg, Sweden, S-413 15; Christer Tennstedt, Smedjegatan 14, Gävle, Sweden, S-802 50

[21] Appl. No.: 211,396

[22] PCT Filed: Oct. 2, 1992

[86] PCT No.: PCT/SE92/00687

§ 371 Date: Apr. 1, 1994

§ 102(e) Date: Apr. 1, 1994

[87] PCT Pub. No.: WO93/07426

PCT Pub. Date: Apr. 15, 1993

[30] Foreign Application Priority Data

Oct. 4, 1991 [SE] Sweden ............................. 9102875

[51] Int. Cl.⁶ .................................................. F25B 21/02
[52] U.S. Cl. ........................... 62/3.61; 62/3.7; 165/185
[58] Field of Search ........................... 62/3.2, 3.61, 3.7; 165/185

[56] References Cited

U.S. PATENT DOCUMENTS

| | | | |
|---|---|---|---|
| 3,088,288 | 5/1963 | Elfving | 62/3.61 |
| 3,088,289 | 5/1963 | Alex | 62/3.7 |
| 3,543,842 | 12/1970 | Marges | 165/82 |
| 3,609,992 | 10/1971 | Cacheux | 165/185 |
| 4,355,518 | 10/1982 | Beitner | 62/3.61 |
| 4,955,203 | 9/1990 | Sundhar | 62/3.61 |
| 5,077,637 | 12/1991 | Martorana et al. | 361/386 |

FOREIGN PATENT DOCUMENTS

| | | | |
|---|---|---|---|
| 2477688 | 9/1981 | France | 62/3.61 |
| 2501727 | 7/1975 | Germany | 62/3.61 |

*Primary Examiner*—William Doerrler
*Attorney, Agent, or Firm*—Thomas J. Engellenner; Lahive & Cockfield

[57] ABSTRACT

A device for regulating the temperature in a room (4) for keeping objects comprises a thermo-electric cooling element (7) connected by one first end (8) thereof to said room through a first heat conducting element, means (16) connected to the thermo-electric cooling element and adapted to cause an electric current to flow through said cooling element, and a second heat conducting element connected to the opposite, second end (10) of the cooling element and adapted to be in contact with a medium (30) for exchange of heat therewith controlled by the electric current through said thermo-electric cooling element. One of the two heat conducting elements is flexible over at least a part (13) of the extension thereof.

10 Claims, 2 Drawing Sheets

THERMOELECTRIC REFRIGERATION SYSTEM WITH FLEXIBLE HEATCONDUCTING ELEMENT

FIELD OF THE INVENTION AND PRIOR ART

The present invention relates to a device for regulating the temperature in a room for keeping objects, said device comprising a thermo-electric cooling element connected by one first end thereof to said room through a first heat conducting element, means connected to the thermo-electric cooling element and adapted to cause an electric current to flow through said cooling element, and a second heat conducting element connected to the opposite, second end of the cooling element and adapted to be in contact with a medium for exchange of heat therewith controlled by the electric current through the thermo-electric cooling element.

A device of this kind is already known through U.S. Pat. No. 4,355,518, which shows how such a device is used so as to control the temperature in a room for keeping objects in a boat in the form of a refrigerator by drainage of heat to the water surrounding the hull of the boat through said second heat conducting element. The definition thermal-electric cooling element relates to all types of thermo-electric elements utilizing the so called Peltier effect so as to transmit heat from a body located on one side of the element to a body arranged on the other side thereof.

The advantage of utilizing a device of this kind for regulating the temperature in a room for keeping objects resides especially in the low energy consumption required to control such a thermo-electric cooling element, which is particularly favourable when there is no possibility to be connected to the electricity supply network, such as for example in a boat. Furthermore, there is in the refrigerator case no need for any movable parts in the form of compressor, pump or fan, as in conventional boat refrigerators, which of course contributes to the low energy consumption and the soundlessness of the refrigerator.

A serious disadvantage of the device according to said American patent resides in the fact that the two first and second heat conducting elements are constituted by rigid thermal conductors, for instance a copper rod, so that the connection between the very wall of the room for keeping objects and the end of the second heat conducting element being in contact with the medium is rigid. This implies primarily that the both ends of the thermo-electric cooling element are fixed in the room and by that the cooling element may be exerted to considerable moments should no strong struts be arranged so as to safely keep a heat conducting element or elements connected thereto in place. The cooling element is rigidly connected to the refrigerator in the device according to U.S. Pat. No. 4,355,518, so that a second heat conducting element in the form of a copper rod has to be held by considerable struts at a high accuracy in order to be located tight against the thermo-electric cooling element and in order to prevent the moments or torques on the thermo-electric element from getting too high.

Another disadvantage of a device of the type described in the American patent consists in the necessity to manufacture different heat conducting elements for using the device in different applications, where the mutual arrangement in the room of the room for keeping objects and a contact surface of the second heat conducting element with said medium is varying. This means in practice that in case of using a device for refrigerators in boats specially dimensioned heat conducting elements adapted to the boat in question have to be provided for the different distances between the bottom of the boat and the most suitable location of the refrigerator. This means that it will of course be difficult to obtain any multiple production of such refrigerators or devices.

The invention is in no way restricted to devices for regulating the temperature in a refrigerator, but several other applications are conceivable, such as for instance medicine boxes and the like. The medium being in contact with the second heat conducting element may be of a number of different types, such as water in a lake, a sea or the like, the atmospheric air, a rock-face, the ground, the chassis sheet of a car and so on.

BRIEF DESCRIPTION OF THE INVENTION

The object of the present invention is to provide a device of the type mentioned in the introduction, which does not have the disadvantages mentioned above of the devices of this type already known, so that a larger multiple production or mass manufacture of such devices and by that a manufacturing cost being sufficiently low to motivate sale successes may be obtained.

This object is according to the invention obtained by making one of the two heat conducting elements of a device of said type flexible over at least a part of the extension thereof.

Thus, the invention is based on the realization that it perhaps would be possible to obtain a flexible thermal conductor, although thermal conductors have to have a considerable cross section and rigid thermal conductors therefor always have been used within the technique of heat conducting. It has turned out that this is well possible, and thanks to the flexibility of at least a part of one of the two heat conducting elements it is possible to avoid great moments or torques on the thermo-electric cooling element without using strong struts as well as to use one and the same device for a mutual localization of the room for keeping objects in question and a contact surface of the second heat conducting element with said medium restricted within a comparatively wide scope.

The flexible heat conducting element part is according to a preferred embodiment of the invention formed by a plurality of flexible thin wires of a material with a high thermal conductivity held together in a bundle. Thanks to the construction of a part of one of the heat conducting elements as an assembly of a plurality of thin wires, it is possible to achieve a total cross section surface resulting in a sufficiently high heat conducting capacity and still ensure that this part of the heat conducting element may be bent.

Further advantages as well as preferred characteristics of the device according to the invention will appear from the other dependent claims and the following description.

BRIEF DESCRIPTION OF THE DRAWINGS

With reference to the appended drawings, below follows a description of preferred embodiments of the invention cited as examples.

In the drawings.

DETAILED DESCRIPTION OF PREFERRED EMBODIMENTS OF THE INVENTION

Figure 1:
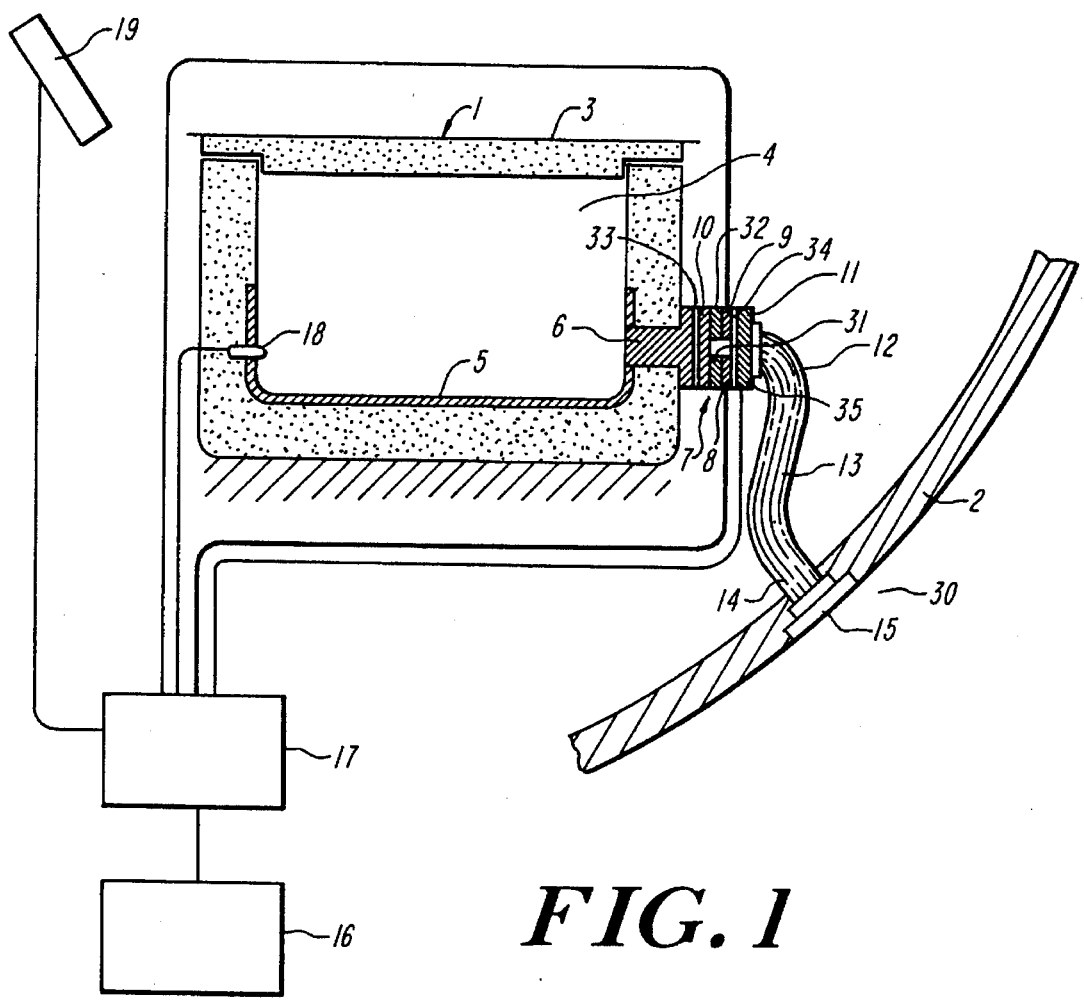
FIG. 1 is a schematic, simplified and partially sectioned view of a first embodiment of the device according to the invention in a first use.

A first preferred embodiment of the device according to the invention is shown very schematically in FIG. 1 in the use with a refrigerator located in a boat. The refrigerator 1, which is intended to be arranged in a hull 2 indicated in the drawing of a boat, such as a sailing boat, close to the bottom thereof, has in a conventional way a lid 3 through which access to an internal room 4 for keeping objects enclosed by lateral walls and a bottom may be offered. A lid and the walls are made of insulating foam. The surfaces of the lower part of the walls and the bottom of the refrigerator being in contact with the room 4 for keeping objects are formed by a shell 5 of a material having a high thermal conductivity, in this case aluminium. This aluminium shell 5 of the refrigerator has a rigid projection 6 being an integral part thereof. The projection 6 extends from the aluminium shell 5 out through the insulating wall of the refrigerator, and a thermo-electric cooling element 7 is rigidly connected to the extremity thereof.

The thermo-electric cooling element 7 consists in a conventional way of two metal pieces 8, 9 of one and the same metal as well as a third metal piece 10 of another metal connecting them through two doped semi conductors 31, 32. Furthermore, an electrically insulating plate 33, 34 is arranged on each side of the rest of the thermo-electric cooling element so that no electric currents may reach the aluminium shell and the heat conducting element arranged on the opposite side of the thermo-electric cooling element, respectively. One of the two semi conductor elements 33 and 34, which have a high thermal conductivity, is P-doped and the other is N-doped. Two interfaces or junctions will be obtained upon applying an electric voltage between the two metal pieces 8 and 9, one of said junctions getting warm and the other cold, so that it in this way will be possible to achieve a heat transfer from one side of the thermo-electric cooling element 7 to the other.

It is intended in the case shown in FIG. 1 to send an electric current in such a direction through the thermo-electric cooling element that the interface or junction of the element located closest to the aluminium shell 5 will get cold and the other interface will get warm, so that heat will be transferred from the refrigerator and through the cooling element.

A copper block 11 is tightly, i.e. heat conducting, rigidly connected to the insulating element 34 of the thermo-electric cooling element 7. The contact surface of the copper block 11 with the thermo-electric element is preferably polished, so that an excellent heat transfer from the thermo-electric element to the copper block may take place.

One end 12 of a bundle 13 of a plurality of thin copper wires is connected to the copper block 11, while the other end 14 of the bundle is rigidly connected to a copper plate 15 immersed into the hull 2 of the boat. The number of the copper wires included in the bundle 13 may advantageously be greater than 1000 and they may each have a diameter of less than 1 mm. This results in a flexible bundle 13 which may be bent for adoption to different distances between the copper plate 15 and the thermo-electric cooling element 7. No high moments or torques may either be transferred through the bundle of thermal conductors from the copper plate to the thermo-electric cooling element.

A battery 16 is arranged to provide an electric current through the thermo-electric cooling element 7 so as to cause a transfer of heat from the aluminium shell 5 to the copper plate 15 or giving it away to the water surrounding the hull of the boat. A regulator 17 is arranged between the battery 16 and the thermo-electric cooling element. A temperature sensor 18 is arranged in the interior of the refrigerator and connected to the regulator 17. The regulator 17 will on the basis of information from the temperature sensor 18 control the current from the battery 16 to the thermo-electric cooling element 7. A current corresponding to an input power of about 4 W may be sufficient so as to obtain a sufficiently efficient removing of heat from the refrigerator. The regulator 17 may of course infinitely variably control the current through the thermo-electric cooling element. It may in this way be ensured that a constant desired temperature is kept in the refrigerator. Furthermore, a solar cell 19 is connected to the regulator 17 for providing energy for driving the latter. Furthermore, a temperature indicator 35 is incorporated in the copper block 11 and connected to the regulator 17. The current of the battery through the thermo-electric cooling element 7 may through information from the temperature sensors 18 and 31 be regulated so that the efficiency is kept at a high level in the system. A great temperature difference between 18 and 31 results in a low efficiency. By choosing one of two different buttons (not shown) on the regulator 17, namely "save" and "normal", a cooling progress will take place mostly economically, i.e. while consuming such a low amount of energy as possible, and so rapidly as possible, respectively, i.e. in a time being so short as possible.

Thus, the first heat conducting element consists in the embodiment of the invention shown in FIG. 1 of the aluminium shell 5 and the rigid projection 6 thereof and the second heat conducting element consists of the copper block 11, the wire bundle 13 and the copper plate 15, and there is accordingly a part of the second heat conducting element which is flexible. However, it would well be possible to instead make the first heat conducting element flexible, and this is illustrated in FIG. 3.

Figure 2:
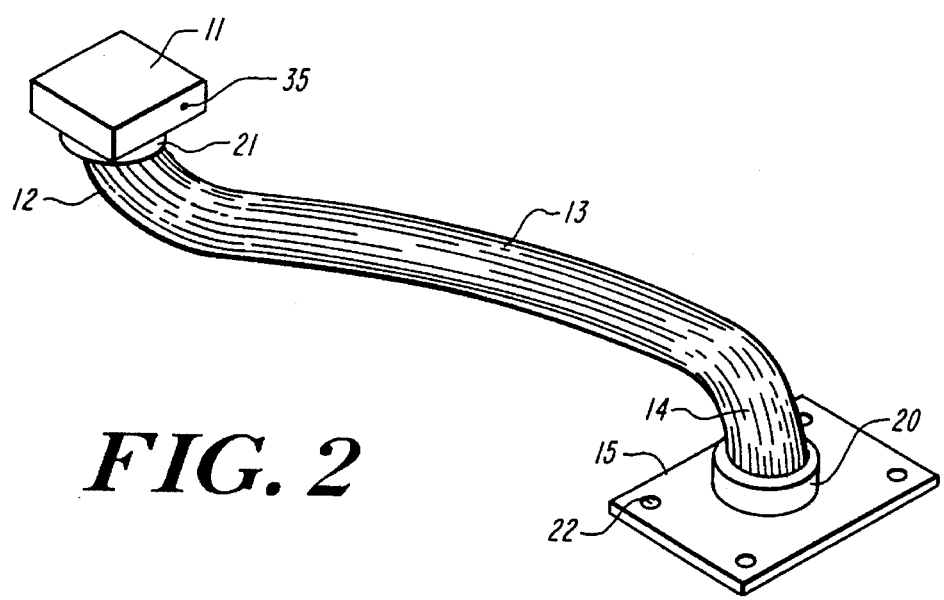
FIG. 2 is a perspective view of a part of the device shown in FIG. 1.

It is shown in FIG. 2 how the heat conducting element having the flexible part, in this case the second conducting element shown in FIG. 1, may be constructed. This heat conducting element comprises a copper plate 15 with a thickness of for instance 3 mm. A ring fastener 20 is secured thereto. The second end 14 of the bundle 13 of copper wires is soldered or melted in the fastening ring 20 and towards the copper plate 15. A very good contact between on one hand the copper wires in the bundle 13 and on the other the copper plate 15 is obtained in this way, so that heat may efficiently be led therebetween. The bundle 13 of copper wires is secured in an analogous way at the first end 12 thereof to the copper block 11 provided with a fastening ring 21. The heat conducting element shown in FIG. 2 may then by the copper block 11 be applied directly to a thermo-electric cooling element or to a rod or the like of a material with a high thermal conductivity rigidly connected thereto or through the copper plate 15 to an element being in the vicinity of the medium, with which exchange of heat is intended to take place. The copper plate 15 has in this case screw holes 22 for securing thereof in the bottom of the hull 2.

Figure 3:
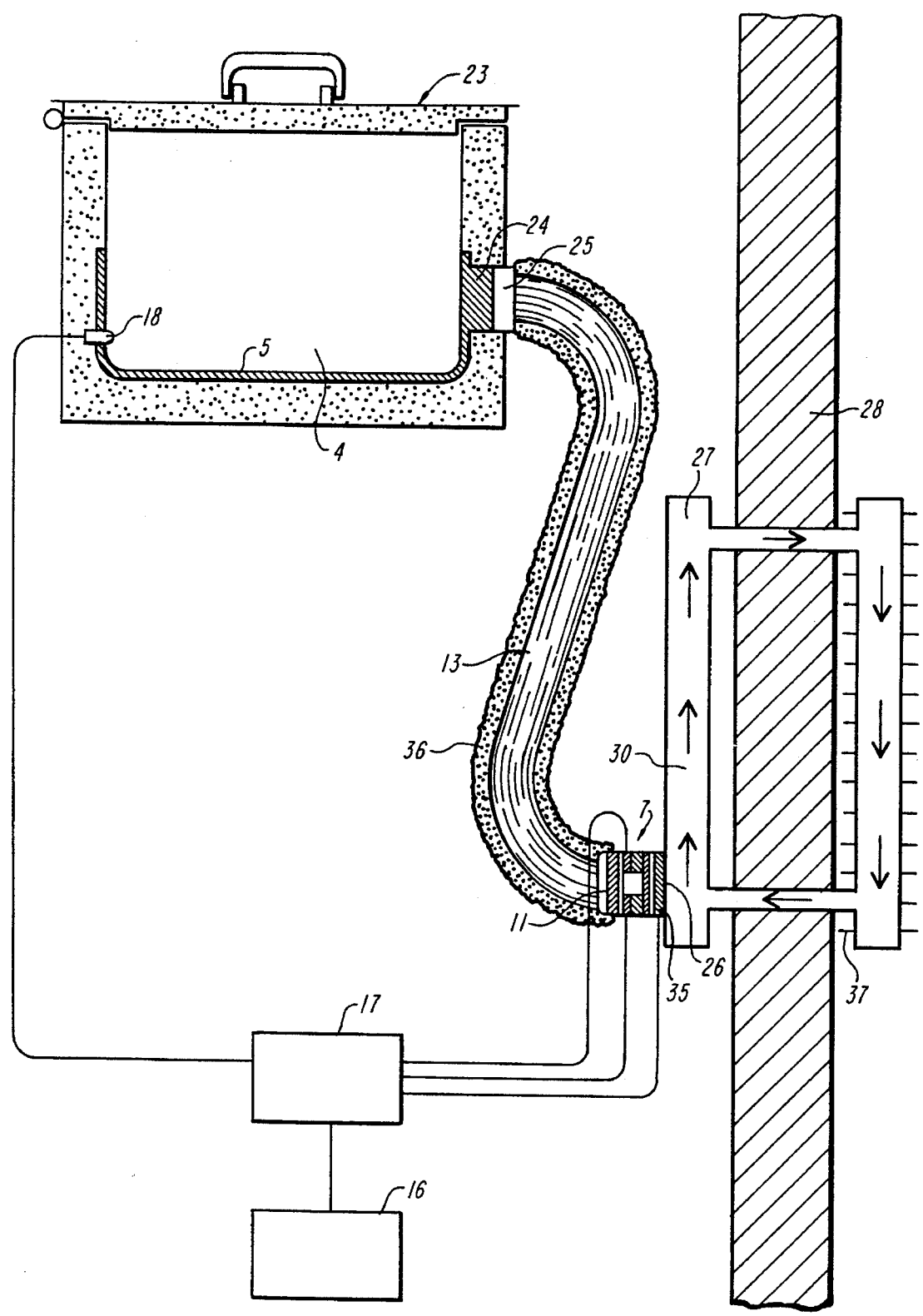
FIG. 3 is a schematic, simplified and partially sectioned view of a device according to a second preferred embodiment of the invention in a second use.

A second preferred embodiment of the invention is illustrated in FIG. 3, and parts with the same function as parts of the embodiment shown in FIG. 1 have in this figure been provided the same references. The device is in this case used for maintaining a constant appropriate temperature in a medicine bag 23, which is constructed in a similar way as the refrigerator shown in FIG. 1. The aluminium shell 5 has also here a projection 24 of aluminium as an integral part therewith. A copper plate 15 corresponding to the copper plate 25 is secured to the end of the projection 24 turned away from the aluminium shell 5. One end of a flexible bundle 13 of thin copper wires is secured to the copper plate 25, while the other end of said bundle is secured to a copper block 11 secured to a thermo-electric cooling element 7. The opposite end of the thermo-electric element 7 is secured to a copper plate 26, which is in direct contact with a medium 30, in this case a mixture of glycol and water, which is adapted to be subjected to convection in a tube loop 27, which passes out through an external wall 28, runs outdoor, where it is surrounded by cooling ribs 37, and after that runs in through the wall 28. A second temperature sensor 35 is also here arranged in the copper plate 26 and has the same function as in FIG. 1. The regulator 17 may after receiving information from the temperature sensor 18 determine in which way and in which direction the electric current of the battery through the thermo-electric cooling element shall be controlled. It is namely conceivable that it in certain cases may be desired to conduct heat away from the medicine bag and in other cases to conduct heat to the medicine bag so as to maintain a certain desired temperature set, and the last mentioned case may occur when the outdoor temperature is for instance 0° C. It is important in this embodiment that the flexible heat conducting element 13 is surrounded by a body 36 containing heat insulating material, since the path between the thermo-electric cooling system and the aluminium shell 5 is long. Thus, the first heat conducting element is in this embodiment constituted by the aluminium shell 5, the copper rod 24, the copper plate 25, the bundle 13 and the copper block 11, while the second heat conducting element here is rigid and consists of a copper plate 26. The aluminium shell 5 could in both embodiments be judged to not belong to the first heat conducting element but be a part of the very room for keeping objects.

Accordingly, a possibility to regulate the temperature, preferably keep it constant, in a room for keeping objects in a way with a good power economy is provided by the invention. The arrangement of the room for keeping objects with respect to the medium with which a heat exchange is intended to take place may be carried out in a varying way without any requirement as to a high accuracy while avoiding harmful moments, primarily on the thermo-electric cooling element.

The invention is of course not in any way restricted to the preferred embodiments shown in the figures, but several possibilities to modification thereof will certainly be apparent to the man skilled in the art without departing from the basic idea of the invention.

It is for instance well possible to use more than one thermo-electric cooling element in one and the same device and then for instance connect a desired number of thermo-electric cooling elements and heat conducting elements in parallel to each other from the room for keeping objects to the contact with said medium. The medium in question could as already mentioned be of an arbitrary type.

One of many other possible fields of use of the device according to the invention would be regulating of the temperature in for example a box containing electronic components sensitive to temperature.

The material declarations made above are only to be interpreted as examples of preferred materials, but for instance the aluminium shell, the copper rods, the copper plates, the bundle of wires and so on may of course be changed for other materials with a high thermal conductivity, preferably any other metal. However, copper is probably to be preferred for the flexible part of the heat conducting element, since it besides a high thermal conductivity also is easy to bend.

We claim:

1. A refrigeration device for use on a boat comprising a room for keeping objects, a thermo-electric cooling element having a first end connected by a first heat conducting element to said room, and a second end connected to a second heat conducting element that is adapted to be thermally coupled with water surrounding the boat for exchange of heat therewith and wherein at least one of the heat conducting elements includes a flexible heat conducting element formed by a plurality of flexible thin wires of a material with a high thermal conductivity, and further comprising a first thermostat means for detecting the temperature in said room and a second thermostat means arranged to detect the temperature of the second heat conducting element at a potion of the element that connects to said thermo-electric cooling element and regulation means for regulating operation of the thermo-electric cooling element in response to said detected temperature information and temperature differences between said first and second thermostat means.

2. A device according to claim 1 wherein the flexible thin wires are made of metal.

3. A device according to claim 2, wherein the metal is copper.

4. A device according to claim 1 wherein said flexible heat conducting element has a first end and a second end and both of said ends are fixed to rigid elements of material with a high thermal conductivity, said rigid elements being adapted for connecting to other rigid elements to form a heat conducting chain between said room and the water surrounding the boat.

5. A device according to claim 4, wherein one of the rigid elements connected to the flexible heat conducting element is adapted to form a heat exchange surface to the water surrounding the boat, and the other rigid element is adapted to be fixed to one end of said thermo-electric cooling element.

6. A device according to claim 1, wherein the second heat conducting element comprises a flexible part and a plate adapted to extend through a boat hull and into contact with the water surrounding the boat.

7. A device according to claim 1 further comprising a battery arranged to provide electric current through the thermo-electric cooling element.

8. A device according to claim 5, wherein said rigid element adapted to form a heat exchange surface to the water is adapted to be in indirect contact therewith.

9. A device according to claim 5, wherein said rigid element adapted to form a heat exchange surface to the water is adapted to be in direct contact therewith.

10. A device according to claim 4, wherein at least one of said rigid elements connected to the flexible heat conducting element is adapted to form a heat exchange surface with said room, and the other said rigid element is adapted to be fixed to one of the ends of said thermo-electric cooling element.

\* \* \* \* \*